United States Patent [19]

Venkataramani et al.

[11] Patent Number: 5,660,877
[45] Date of Patent: Aug. 26, 1997

[54] METHOD FOR FABRICATING LAMELLAR PIEZOELECTRIC PREFORM AND COMPOSITE

[75] Inventors: Venkat Subramaniam Venkataramani, Clifton Park; Lowell Scott Smith, Niskayuna, both of N.Y.

[73] Assignee: General Electric Company, Schenectady, N.Y.

[21] Appl. No.: 538,151

[22] Filed: Oct. 2, 1995

[51] Int. Cl.$^6$ ........................................ B05D 5/12
[52] U.S. Cl. ................ 427/100; 427/294; 427/376.2
[58] Field of Search ............................. 427/100, 294, 427/376.2

[56] References Cited

U.S. PATENT DOCUMENTS

| | | | |
|---|---|---|---|
| 4,122,041 | 10/1978 | Mahler | 251/449 |
| 4,227,111 | 10/1980 | Cross et al. | 310/358 |
| 4,330,593 | 5/1982 | Shrout et al. | 428/407 |
| 5,539,965 | 7/1996 | Safari et al. | 29/25.35 |

OTHER PUBLICATIONS

R. E. Newnham et al., "Composite Piezoelectric Transducers," in Materials in Engineering, vol. 2, Dec. 1980, pp. 93–106.

"Freeze–formed Silica Fibres", W. Mahler, et al., May 1980, Central Research & Development Dept., E.I. duPont de Nemours & Company, Wilmington, Delaware 19898.

"Injection Molded Fine–Scale Piezoelectric Composite Transducers", LJ Bowen, et al. 1993 Ultrasonics Symposium, 1993 IEEE, pp. 499–503.

"Modeling 1–3 Composite Piezoelectrics: Thickness–Mode Oscillations", WA Smith, BA Auld, IEEE Trans. on Ultrasonics Ferroelectrics and Frequency Control, vol. 38, No. 1, Jan. 1991.

"Properties of Composite Piezoelectric Materials for Ultrasonic Transducers", WA Smith, et al., 1984 Ultrasonics Symposium, IEEE 1984, pp. 539–544.

"The Role of Piezocomposites in Ultrasonic Transducers", WA Smith, 1989 Ultrasonics Symposium, 1989 IEEE, pp. 755–766.

"Development of 1–3 Ceramic–Air Composite Transducers", C. Oakley, et al., SPIE vol. 1733 (1992) pp. 274–283.

"PZT–Epoxy Piezoelectric Transducers: A Simplified Fabrication Procedure", HP Savakus, et al., Mat. Res. Bulletin, vol. 26, pp. 677–680, 1981.

*Primary Examiner*—Benjamin Utech
*Attorney, Agent, or Firm*—Noreen C. Johnson; William H. Pittman

[57] ABSTRACT

A process for fabricating a fully dense ceramic preform for a piezoelectric or electrostrictive composite exhibiting anisotropic 3—3 connectivity. The process involves preparing a homogeneous slurry of a piezoelectric ceramic powder, a binder, dispersant, and a liquid medium. The slurry is freeze dried to form a ceramic preform having ceramic interconnected lamelli having greater connectivity in the Z direction than in the X and Y direction, and having interconnected interlamellar regions. The composite is fabricated by infiltrating the fully dense ceramic preform with an infiltrate phase in the interconnected interlamellar regions. The composite may be poled to produce a piezoelectric composite for electromechanical devices exhibiting anisotropic 3-3 connectivity.

3 Claims, 3 Drawing Sheets

METHOD FOR FABRICATING LAMELLAR PIEZOELECTRIC PREFORM AND COMPOSITE

FIELD OF THE INVENTION

This invention relates to the fabrication of piezoelectric ceramic preforms and piezoelectric ceramic-polymer composites. In particular, it is related to piezoelectric ceramic-polymer composites that exhibit anisotropic 3-3 connectivity comprising a porous, sintered piezoelectric ceramic preform and an infiltrate phase filling the pores of the preform. The invention is also related to a method of making piezoelectric composites for electromechanical devices that exhibit anisotropic 3-3 connectivity by forming a porous, sintered piezoelectric ceramic preform comprising an interconnected network of lamelli with interconnected interlamellar regions and infiltrating the interlamellar regions of the preform with an infiltrate phase.

BACKGROUND OF THE INVENTION

Piezoelectric ceramic-polymer composites and piezoelectric ceramics are used in transducers for medical ultrasound imaging. In medical ultrasound there is an increasing need to improve the imaging range and resolution, as determined by the sensitivity and bandwidth of the transducer. Piezoelectric composites enjoy at least three major advantages over piezoelectric ceramics. These advantages are reduced specific acoustic impedance (Z), increased thickness coupling ($k_t$), and reduced planar coupling ($k_p$). As a result, piezoelectric composite transducers provide medical imaging with better axial and lateral resolution.

For high frequency applications, such as ultrasonic imaging, the piezoelectric ceramic elements in the composite must have extremely small dimensions for sufficiently high frequencies to be attained. The fineness of these composite array elements makes composite manufacturing extremely difficult.

Presently, piezoelectric composites having 1-3 connectivity are commonly used in medical ultrasound transducer applications. 1-3 connectivity composites are commonly used because of the significantly reduced planar coupling constants and reduction in the lateral coupling modes that can be achieved over those that can be achieved by using homogeneous ceramic or isotropic 3-3 connectivity composites of the same materials.

A 1-3 connectivity composite is one where one phase, typically the ceramic phase, is self connected in one direction (Z direction or thickness direction) of the composite, while the other phase, typically the infiltrate phase, is self connected in three directions (X, Y, Z directions) of the composite. Several attempts have been made to demonstrate viable manufacturing processes for 1-3 connectivity composites. A procedure has been developed for assembling composites from extruded piezoelectric fibers using automated fiber placing and assembly. This approach is effective for coarse composites having fibers of approximately 0.5–1.0 millimeter diameter, which are strong enough to be machine handled. For finer scale composites, a typical practice is to dice the ceramic composite structure from solid ceramic using a wafer dicing saw. In this case, a portion of the solid ceramic piece is left in tact as a support for the piezoelectric fiber array. This technique is referred to as dice and fill. In a 1-3 connectivity composite, the minimum dimensions of a ceramic rod or fibers and the spaces are limited by the dicing blade and the mechanical strength of the ceramic. As a result, 1-3 composites do not always satisfy the increasing need for high frequency transducer operation in medical ultrasound applications.

It is desirable to have a manufacturing method to fabricate piezoelectric composites that can be used as electromechanical devices, such as transducers, that have a structure of an interconnected lamelli and an interconnected interlamellar region which can be processed into an anisotropic 3-3 connectivity composite having improved electromechanical properties. It is also desirable to have a method of fabricating a piezoelectric composite that can be used in an electromechanical device having reduced planar coupling, a high thickness coupling constant, and reduced specific acoustic impedance.

SUMMARY OF THE INVENTION

In accordance with one aspect of the invention, a process for fabricating a fully dense ceramic preform for a piezoelectric or electrostrictive composite exhibiting anisotropic 3-3 connectivity involves preparing a homogeneous slurry comprising a ceramic powder selected from the strongly piezoelectric or strongly electrostrictive ceramic material, an organic binder, a dispersant, and a freeze dryable liquid medium, or preparing a homogeneous gel from metal alkoxides and carboxylates in a freeze dryable solvent and then forming the preform by freeze drying the ceramic slurry or gel in a mold with a unidirectional heat flow so that the ceramic material is frozen in columnar structures oriented perpendicular to a thermally conducting base to reduce the lateral connectivity of the columnar ceramic structures and to have greater connectivity of the ceramic structure in the Z direction; and then sintering the ceramic preform for a sufficient amount of time at a sufficient temperature to densify the ceramic body to at least about 95% of theoretical density to produce a fully dense piezoelectric preform.

In accordance with another aspect of the invention, the fully dense piezoelectric or electrostrictive ceramic preform may be used to fabricate a piezoelectric or electrostrictive composite exhibiting anisotropic 3-3 connectivity and includes a fully dense sintered piezoelectric or electrostrictive ceramic phase of interconnected lamelli where the connectivity of the lamelli in a Z direction is greater than the connectivity of the lamelli in a X and Y direction and the connectivity of the lamelli in the X and Y direction is about equal, or substantially equal, that is infiltrated with an infiltrate phase under vacuum in the interconnected interlamellar region of the preform, thereby forming an anisotropic 3-3 connectivity composite. The process also may include placing electrodes at the upper and lower surfaces of the composite so as to establish electrical contact with opposing surfaces of each of the fully dense elements. In a narrower aspect, the fully dense anisotropic 3-3 connectivity composite is poled in a high electric field at a temperature just below the Curie temperature of the ceramic material for a time sufficient to produce a piezoelectric composite exhibiting anisotropic 3-3 connectivity.

In accordance with another aspect of the invention, the invention may also be described as a process to fabricate a piezoelectric anisotropic 3-3 connectivity composite electromechanical device having a specific acoustic impedance of about 20 MRayls or less, a thickness coupling constant greater than about 0.4, and a planar coupling constant less than about 0.4. Still another aspect of the invention includes a process to form a piezoelectric composite having anisotropic 3-3 connectivity which comprises forming a piezoelectric ceramic preform of interconnected lamelli where the connectivity of the lamelli in the Z direction is greater than the connectivity of the lamelli in the X and Y direction, and the connectivity of the lamelli in the X and Y direction is about equal, and where the lamelli comprise from about 5 volume percent to about 80 volume percent of the composite and are about 200 microns or less in width; sintering the ceramic preform at a temperature and for a time sufficient to densify the piezoelectric ceramic preform to at least about 95 percent of theoretical density to produce a fully dense preform; infiltrating the piezoelectric ceramic preform with an infiltrate phase in the interconnected interlamellar region of the preform and poling the piezoelectric composite in a high electric field at a temperature just below the Curie temperature of the ceramic material.

Another aspect of the invention is a process to form an electrostrictive composite having anisotropic 3-3 connectivity with a ceramic phase and an infiltrate phase, which comprises: forming an electrostrictive ceramic preform of interconnected lamelli where a connectivity of the lamelli in a Z direction is greater than the connectivity of the lamelli in a X and a Y direction, and the connectivity of the lamelli in the X and Y direction is substantially equal, and where the lamelli comprise from about 5 to 80 volume percent of the composite and are about 200 microns or less in width; sintering the ceramic preform at a temperature and for a time sufficient to densify the electrostrictive ceramic preform to at least about 95 percent of theoretical density to produce a fully dense preform; infiltrating interconnected interlamellar regions of the electrostrictive ceramic preform with the infiltrate phase under vacuum to form the electrostrictive composite having the ceramic phase and the infiltrate phase.

An advantage of the composite fabricated by the method of this invention is that the composite is anisotropic with 3-3 structural connectivity, but has the electromechanical properties of a 1-3 connectivity composite. All other known 3-3 connectivity composites are isotropic. Another advantage of the invention is that an electromechanical device utilizing the anisotropic 3-3 connectivity composite of this invention has less lateral connectivity than a device utilizing an isotropic 3-3 connectivity composite, thereby reducing the planar coupling modes of the device. As a result, the combination of the coupling modes achieved by an electromechanical device manufactured by the instant invention leads to better resolution and imaging range in medical ultrasound applications than those achieved by devices made from isotropic 3-3 connectivity composites. Furthermore, the method of fabrication of this invention allows the use of finer feature sizes of the lamelli and interlamellar regions than are obtainable from the present state of the art processes for fabricating 1-3 composites. Thus, the devices fabricated by the method of the instant invention may be operated at the higher frequency ranges needed in medical ultrasound applications.

DETAILED DESCRIPTION OF THE INVENTION

Described herein is a process exemplary of one aspect of the invention, in which a piezoelectric or electrostructure ceramic interconnected preform for an anisotropic 3-3 connectivity composite is fabricated by freeze drying. The ceramic preform has a ceramic phase of interconnected ceramic lamelli. The term "lamelli" herein means ceramic fibers, rods or lamelli having columnar structures that are interconnected to one another. The interconnected lamelli is that region that contains interconnected walls of ceramic material which is interconnected with itself on three planes on the X, Y and Z directions. The interconnected ceramic lamelli of the preform are arranged in an ordered array to form the anisotropic 3-3 connectivity composite. The connectivity of the ceramic lamelli is greater in the Z direction than the X and Y direction. The connectivity of the lamelli in the X and Y directions is essentially equal. The ceramic preform body is sintered to remove any binder present in the preform and to produce a densified ceramic body with at least about 95% of theoretical density. To produce the anisotropic 3-3 connectivity composite, the preform is then infiltrated with an infiltrate phase. The infiltrate phase is infiltrated in the interconnected interlamellar region of the ceramic preform. The interconnected interlamellar region, also referred to as interlamellar region, means the region of the composite material that lies between the interconnected lamelli. This region is also connected with itself on three planes. The infiltrate phase of the composite may be a polymer, a glass, or a cement. The interconnected interlamellar region forms a skeleton that is intertwined with the ceramic phase, the interconnected lamelli of the composite. Electrodes may then be applied in a known manner. Poling of the ceramic phase may be performed in a known manner to produce a piezoelectric composite.

The invention may also be described as a method for making a piezoelectric composite article, comprising the steps of forming a porous, sintered, piezoelectric ceramic preform which comprises a plurality of interconnected lamelli that are partially separated from one another by an interconnected interlamellar region, sintering the ceramic preform at a temperature and for a time sufficient to densify the ceramic body to at least about 95% of theoretical density to produce a fully dense preform, and infiltrating the interlamellar regions with an infiltrate phase comprising a polymer, a low specific impedance glass, or a low specific acoustic impedance cement, or mixtures thereof; and heat treating the infiltrated ceramic preform to react the infiltrate phase with a ceramic phase, thereby forming an anisotropic 3-3 connectivity composite. Poling of the composite may be done to produce a piezoelectric or electrostrictive composite.

Figure 1B:
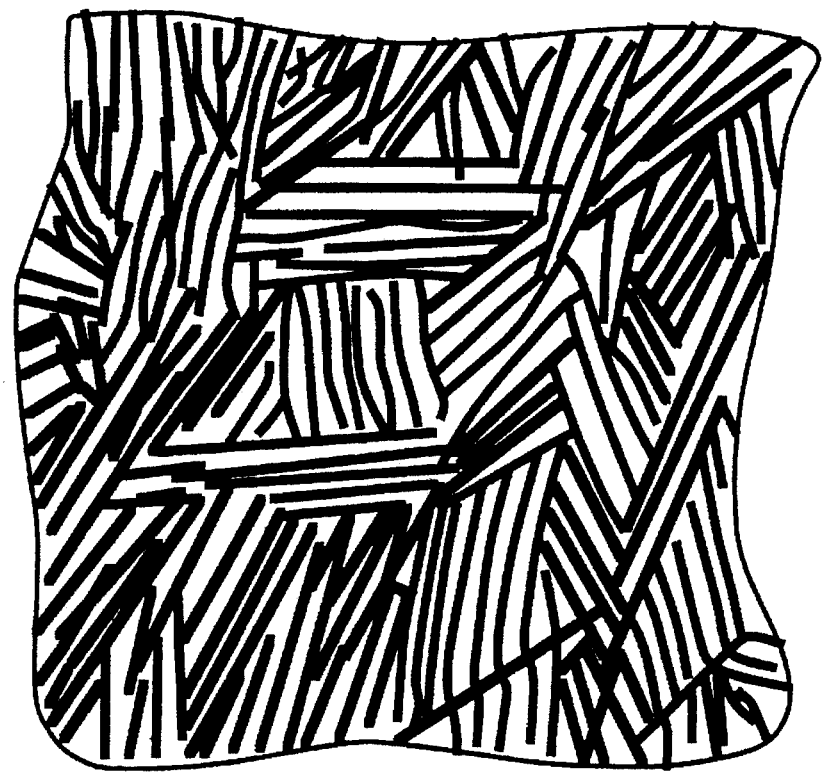
FIGS. 1A and 1B are schematic views which illustrate the alignment of the interconnected lamelli of the anisotropic 3-3 connectivity composite of the instant invention from a side view (1A) and a top view (1B), as fabricated by the method of this invention.
Figure 1A:
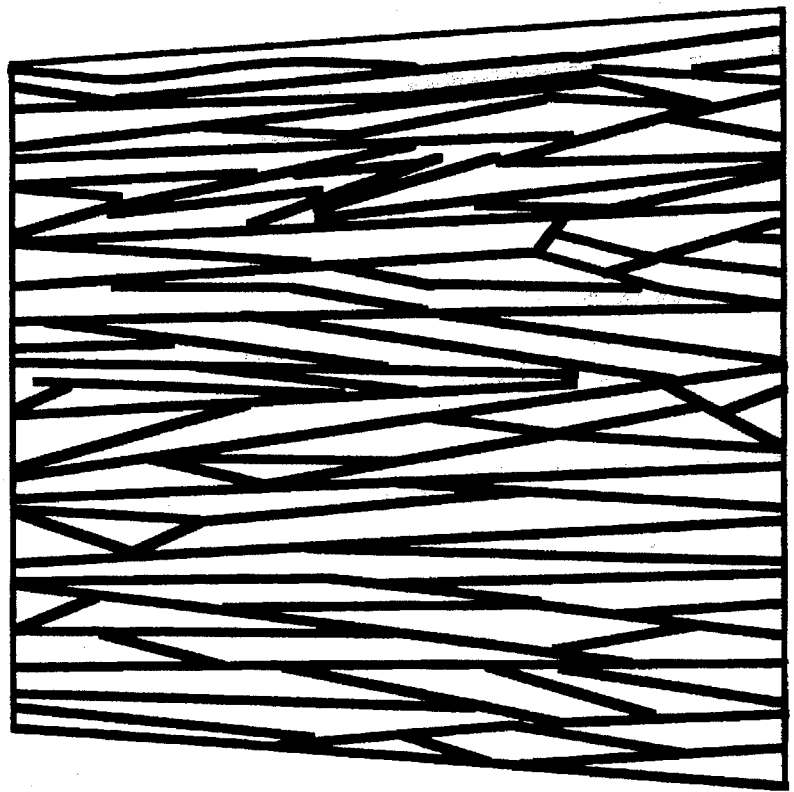

The sintered ceramic preform may be made by the steps comprising: forming a homogeneous slurry containing about 5–80 volume percent of the piezoelectric ceramic powder, a freeze dryable liquid medium such as water or tertiary butyl alcohol, a suitable binder such as polyvinyl alcohol, and a dispersant. The ceramic powder is at least temporarily dispersed homogeneously within the liquid medium of the slurry. The homogeneous slurry is then cooled to a temperature below the freezing point of the liquid medium for a time sufficient to cause the directional solidification of the liquid medium and progressive segregation of the liquid medium from the slurry, wherein the directional solidification and segregation of the liquid medium causes the morphological ordering of the ceramic powder (also referred to as ceramic particles) into a lamellar ceramic powder aggregate, where the lamelli are substantially parallel to one another although they are interconnected in three planes. The term "substantially parallel", as used herein, means that the lamelli have a distinct orientation relative to one another that is not random and favors one direction as demonstrated in FIGS. 1A and 1B. Further, the ceramic powder is frozen in columnar structures oriented perpendicular to a thermally conducting base to reduce the lateral connectivity of the columnar ceramic structures in the X and Y direction. The morphological ordering of the ceramic powder (particles) in the preform means that upon freeze drying, interconnected lamelli are obtained where the connectivity of the lamelli in the Z direction is greater than the connectivity of the lamelli in the X and Y direction, and the connectivity of the lamelli in the X and Y direction is essentially equal. Upon solidification of the ceramic interconnected lamelli after freeze drying, the frozen liquid medium is removed in order to obtain a ceramic article in the green state. The ceramic preform in the green state is then sintered at a temperature and for a time sufficient to causes the ceramic particles to become densified to at least about 95% of theoretical density.

The ceramic preform is porous because the ceramic lamelli, while interconnected, are also partially spaced apart creating interconnected interlamellar regions. These interlamellar regions are filled with an infiltrate phase such as a polymer, a low specific acoustic impedance glass or a low specific acoustic impedance cement. Examples of polymers may be an epoxide, urethane, elastomer, silicone, and mixtures thereof. By low specific acoustic impedance glass and low specific acoustic impedance cement is meant those glasses and cement with a specific acoustic impedance of less than or about 12 MRayls. The ceramic preform filled with an infiltrate phase produces an anisotropic 3-3 connectivity composite, herein also referred to as piezoelectric composite, or ceramic-polymer composite. The result is a piezoelectric composite having two primary phases, one comprising the original ceramic phase of the preform and the other comprising the infiltrate phase.

The step of forming the slurry is known to those familiar with the ceramic arts and mineral processing. A piezoelectric or electrostrictive ceramic powder (particle) is utilized. The piezoelectric or electrostrictive powder may be a metal titanate, metal zirconate, metal niobate, metal tantalate, metal tungstate, metal stannate, or solid solution thereof. To illustrate, commonly used powders may be lead zirconate titanate, also referred to as PZT or lead magnesium niobate-lead titanate, also referred to as PMN-PT. Examples of metal titanates that may be used include barium titanate, lead titanate, strontium titanate, and bismuth titanate. An example of a metal zirconate is lead zirconate. Examples of metal niobates are lead barium niobate, strontium barium niobate, lithium niobate, and lead metaniobate. Solid solutions include lead zirconate titanate, lead magnesium niobate-lead titanate, lead zinc niobate-lead titanate. Any ceramic powder that will form a stable dispersion in a liquid medium such as water or tertiary butyl alcohol, may be used. However, in order to stabilize the dispersion of the ceramic powder in the liquid medium, it is preferred that the median particle size be in the range of about 0.2 to 5.0 microns, and that the maximum particle size be about 10 microns or less. A liquid medium may be any liquid medium in which a dispersion of ceramic powder or ceramic particles may be formed in a slurry. The liquid medium shall be compatible with the steps to be utilized for cooling and removal of the liquid medium. In particular, if it is desired that the frozen liquid medium be removed by sublimation, the liquid medium may be selected so as to have a vapor pressure at or just below the melting point that permits removal of the liquid medium at a reasonable rate so as to be commercially viable. For instance, a liquid medium having a vapor pressure at its melting point of at least 0.1 torr is preferred if sublimation is to be used in a step of removing the liquid medium. Liquid media such as water, cyclohexane, tertiary butyl alcohol, and carbon tetrachloride may be used in such a case. It may also be desirable to utilize solutions of these or other liquid media so as to enhance the ability of the liquid medium to be directionally solidified, to enhance the morphology of the directionally solidified liquid medium so as to form the interconnected lamelli having greater connectivity in the Z direction.

A dispersant or deflocculant is preferably used in the liquid medium to colloidally stabilize the dispersion of the ceramic powder in the liquid medium. Any dispersant that stabilizes the slurry, and that is compatible with the other steps used to form the ceramic preform, as well as the intended application of the resultant composite, may be utilized.

Binding agents or binders may also be incorporated into the slurry. The use of binders to develop green state ceramic articles is well known in the ceramic arts. A principle reason for the use of binders in the present invention is to give cohesion to the resultant ceramic morphology. A binder should be selected so as to take into consideration potential interaction with the ceramic powder during sintering. Binders may be particularly useful when larger particle sizes are utilized. Examples of binders for use in the present invention include: polyvinyl alcohol, methyl cellulose, and polyalkyl and aryl acrylates.

Sintering agents may also be incorporated into the slurry. The use of, purpose for, and materials comprising sintering agents are well known in the ceramic arts. Surfactants may also be added to the liquid medium to enhance the ability of the liquid medium to wet the surfaces of the ceramic particles or powder, and thus assist in the formation of a stable dispersion of the ceramic powder in the slurry. In this sense, they aid in the formation of the slurry by serving as detergents to increase the wetability of the particles in the liquid medium. It is preferred that binders, dispersants, and sintering agents not crystallize upon cooling, so as to not interfere with the morphology of the ceramic lamelli. However, depending on the degree of interference and the intended use of the ceramic preform, such additives may include materials that crystallize upon freezing.

For the formation of a gel from metal alkoxides and carboxylates in a freeze dryable solvent, techniques known to those skilled in the art are used. Metal alkoxides may include titanium propoxide and zirconium propoxide; carboxylates may include lead acetate and lanthanum acetate.

Following the step of forming the slurry is the step of cooling the slurry to a temperature below the freezing point of the liquid medium in a manner and for a time sufficient to cause the directional solidification of the liquid medium in the progressive segregation of the liquid medium from the slurry. A directional solidification and segregation of the liquid medium causes the morphological ordering of the ceramic powder (particles) into a lamellar ceramic powder aggregate. This ceramic powder aggregate is an interconnected ceramic phase that contains interconnected walls of ceramic material that is interconnected with itself on three planes in the X, Y and Z directions. The connectivity of the lamelli in the Z direction is greater than the connectivity of the ceramic lamelli in the X and Y direction, and the connectivity of the lamelli in the X and Y direction is essentially equal.

Known methods and means for cooling the slurry may be employed to promote directional solidification of the liquid medium and the ceramic powder. So long as the freezing conditions are controlled to remove the heat in a preferred direction, the lamelli grow by directional solidification of the liquid medium and the progressive segregation of the liquid medium from the remaining slurry. The lamelli are aligned parallel to the direction of the heat flow. The unidirectional heat flow is through the thermally conducting base of the mold so that the resulting frozen ceramic columnar structures are oriented perpendicular to the base. Upon cooling, the pure liquid medium first nucleates and crystallizes, thereby depleting the remaining dispersion of the pure liquid and leaving a slurry with a lower concentration of liquid medium and a higher concentration of ceramic powder. The difference between the freezing temperature of the pure liquid medium and the slurry which continues to change in concentration during the coarse of the freezing process may be only a few tenths of a degree or may be many degrees, depending on the chemistry of the system, particularly on the concentration and nature of the ceramic powder, the dispersants, and the binders in the liquid. The spacing and the morphology of the crystallized liquid medium defines the shape of the space containing the remaining concentrated slurry, and thus the shape of the lamelli which result when the remaining concentrated slurry ultimately freezes upon further decrease in the temperature. The lamelli have the approximate shape of the interstitial spaces within the directionally solidified liquid, and the dendrites of the directionally solidified liquid in turn define the size and shape of the interlamellar region that is interconnected between the interconnected lamelli.

The sufficient concentration of ceramic powder or particles to form interconnected lamelli is in the range of about 5–80 volume percent. A preferred composition of lamelli is from about 5–60 volume percent ceramic powder. A most preferred composition of lamelli is from about 5–30 volume percent ceramic powder. The width of the individual interconnected lamelli may be about 200 microns or less. More preferably, the width of the interconnected lamelli may be about 50 microns or less and most preferably the width of the interconnected lamelli may be about 5 microns or less.

In the instant invention, a structure of the ceramic preform is not random in three dimensions, but consist of a ceramic phase of lamelli that are substantially parallel to one another although they are interconnected in three planes. The anisotropic material characteristics of the later produced ceramic-polymer composite of the instant invention occurs because the ceramic lamelli are aligned substantially parallel to one another. The dielectric constant of the anisotropic 3-3 connectivity composite provides evidence of alignment of the lamelli in a favored direction. The anisotropic material characteristics displayed by electromechanical devices made by the method of the instant invention from piezoelectric anisotropic 3-3 connectivity composites render the devices superior to those devices made from isotropic 3-3 connectivity composites of the same or similar chemical composition. The anisotropic 3-3 connectivity composite that is made by the method of this invention is the subject of commonly owned and assigned copending patent application Ser. No. 08/531,840, filed Sep. 22, 1995, now U.S. Pat. No. 5,591,372, (Attorney Docket No. RD-24,253), incorporated herein by reference.

In a preferred embodiment, the step of removing the frozen liquid medium is accomplished by its sublimation. The combination of the steps of cooling the slurry until it freezes and removing the liquid medium is a process known as freeze drying. This is done by heating the frozen slurry containing the frozen liquid medium at a reduced pressure, lower than atmospheric pressure, so as to supply the latent heat necessary for sublimation (latent heat of evaporation) yet not exceed the melting point of the liquid. In order for freeze drying to be done in a commercially feasible period of time, a liquid dispersion medium with relatively high vapor pressure at its melting point should be selected. As an example, a vapor pressure at the melting point of the frozen liquid medium should be greater than about 0.1 torr. Examples of the liquid media are water, cyclohexane, tertiary butyl alcohol, carbon tetrachloride, and p-xylene.

The product obtained by freeze drying in this invention is the starting piezoelectric ceramic powder compacted into the morphology discussed above. Along with the powder particles the product may also contain ingredients, such as solutes which have been added to the slurry and rejected by the liquid during its segregation on freezing, for instance binders and dispersants if they have been added. These solutes generally are removed during the sintering of the ceramic preform.

Upon removing the liquid medium, the lamellar ceramic powder morphology is in a green state. The lamelli are separated by complementary interlamellar or interfibrillar interconnected spaces. These interlamellar interconnected spaces are complementary in that they correspond to the spaces formally occupied by the frozen liquid medium which, as described above, originally define the shape of the lamelli.

The green freeze dried lamellar preform may be sintered directly by the step of heating the preform at a temperature and for a time sufficient to cause the ceramic particles to become bonded to one another to achieve a theoretical density of at least 95%. A theoretical density of about 97% or greater is preferred. Various known techniques of sintering may be employed, depending on the ceramic materials chosen and the presence of binders, dispersants, and sintering agents.

The steps of forming the piezoelectric ceramic preform and sintering are followed by the step of infiltrating the infiltrate phase into the interconnected interlamellar regions of the preform. This infiltrate phase may be polymers, low specific acoustic impedance glasses, low specific acoustic impedance cements, or mixtures thereof. Examples of polymers may be epoxies, urethane, elastomer, silicone and mixtures thereof. By low specific acoustic impedance glass and low specific acoustic impedance cement is meant those glasses and cements with an acoustic impedance of less than or about 12 MRalys. Any suitable method of infiltrating the infiltrate phase may be utilized, including infiltration of a molten liquid, chemical vapor deposition, infiltration of a liquid precursor, and subsequent conversion to form the infiltrate phase. The infiltrate phase is treated so as to solidify the infiltrate in the interconnected interlamellar regions of the preform. The infiltrate phase comprises from about 20 to 95 volume percent of the piezoelectric composite and the width of each interlamellar regions about 500 microns or less, more preferably the width is about 100 microns or less, and most preferably the width is about 10 microns or less. The product achieved is the anisotropic 3-3 connectivity composite having a piezoelectric ceramic phase and an infiltrate phase.

Upon forming the anisotropic 3-3 connectivity composite, the composite may be electroded in a known manner, for example by depositing a conventional electrode material, such as silver, gold, palladium, or an electrically conductive polymer, on the planer surfaces to establish electrical contact with the ceramic elements. To render the composite strongly piezoelectric, the elements may then be poled in a known manner, i.e. a strong electric field is applied to the elements at a temperature just below the Curie temperature, to create a polar axis. Alternately, the poling may be performed on the ceramic preform before infiltration of the infiltrate phase.

The ceramic preform and the infiltrate phase may be described as interpenetrating phases. The present invention is now further described by the following examples.

EXAMPLE 1

A slurry containing the required volume fraction of the piezoelectric ceramic powder, a freeze dryable liquid medium such as water or tertiary butyl alcohol, a suitable binder such as PVA, and a dispersant is mixed well. The slurry is then deaired in vacuum and poured into a mold made up of thermally insulating walls, such as acrylic/polystyrene, and a thermally conducting base, such as aluminum or other metal, which has been chilled at liquid nitrogen temperature. The mold has a thermally conducting base or plate that is adapted to be cooled with liquid nitrogen to provide a sharp thermal gradient, and induce directional solidification. The slurry is placed in a freeze dryer and left to freeze at about $-50°$ C. Due to the unidirectional cooling and phase separation of solid and solvent phases, columnar structures of ceramic solid separated by liquid phase are formed. The frozen mass is then evacuated to less than 1 millitorr and heated to approximately about 50° C. to sublime the solvent phase leaving the columnar structure of the ceramic phase. After freeze drying, the piezoelectric ceramic preform comprising a network of interconnected lamelli as described elsewhere herein, is removed from the mold and then sintered. The ceramic precursor structure thus obtained is sintered under standard conditions of temperature and atmosphere, about 1200° C. for 2 hours in air, to densify the ceramic columns to at least about 95% theoretical density. The dense open structured piezoelectric ceramic preform is then impregnated or infiltrated with a suitable infiltrate phase such as epoxy under vacuum and heat treated to polymerize. A composite structure then may be finished to the required dimensions of length, width and thickness. Evaporated or sputtered gold electrodes are applied to the top and bottom surfaces. Suitable backing and matching layers may be affixed to the composite plate. The plate may be flexed in the direction normal to the thickness dimension so as to break off the lateral conductivities to minimize the lateral coupling. The plate further may be subdiced as needed into a set of arrays.

The volume fraction of ceramic may be varied to control the size of the columns and the intercolumnar gap. The variations in the particle size of the powder, the type and amount of binder, affect the column homogeneity, and the intercolumnar spacing or the interconnected interlamellar region. The bottom base may be designed in the mold to have alternative areas of metal and nonwetting thermal insulator to force the ceramic to freeze out in specific columnar areas.

Figure 2A:
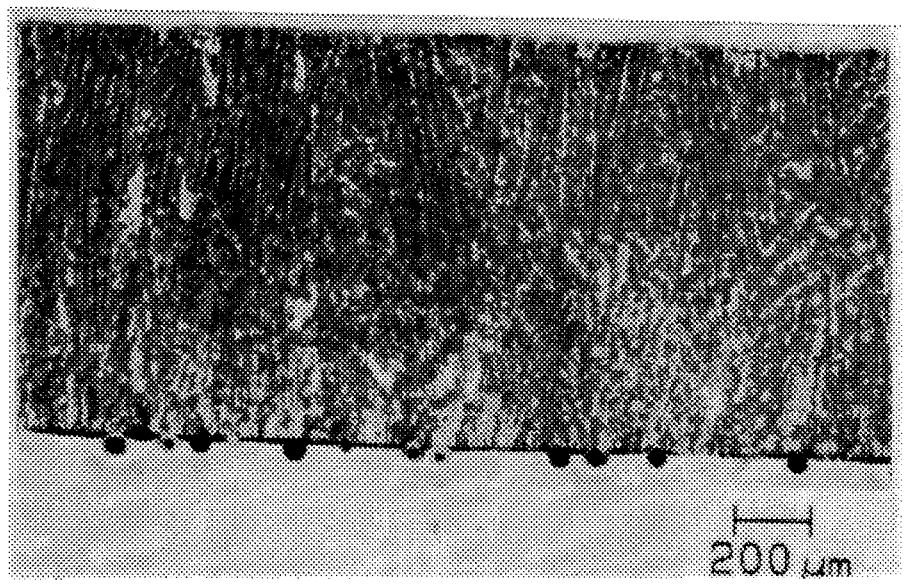
FIGS. 2A and 2B are optical photomicrographs of a 60 volume percent PZT-5H-40 volume percent polyether amine epoxy anisotropic 3-3 connectivity composite showing a side view (2A) and top view (2B) of the composite fabricated by the method of this invention.
Figure 2B:
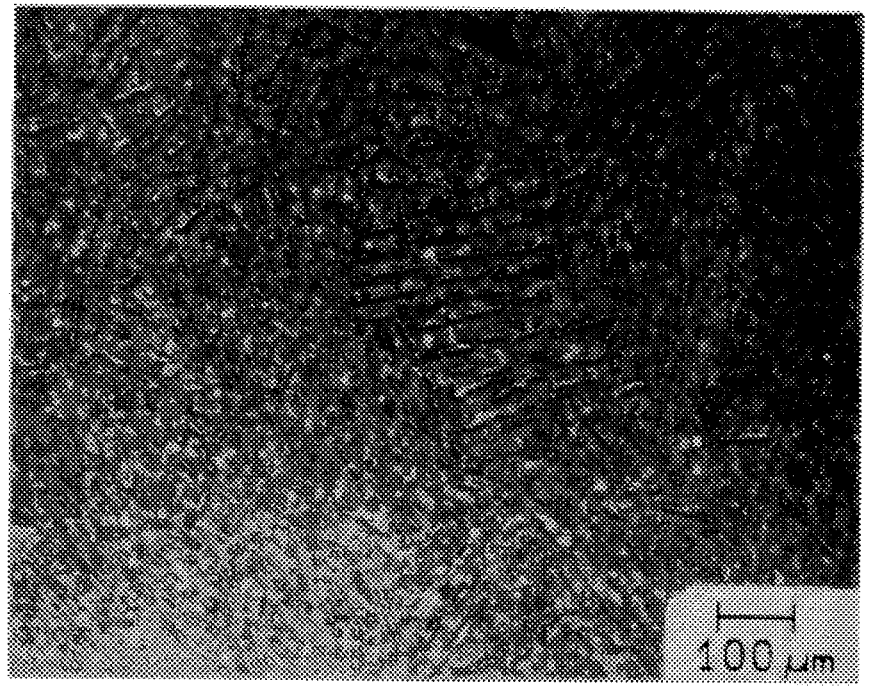
Figure 3A:
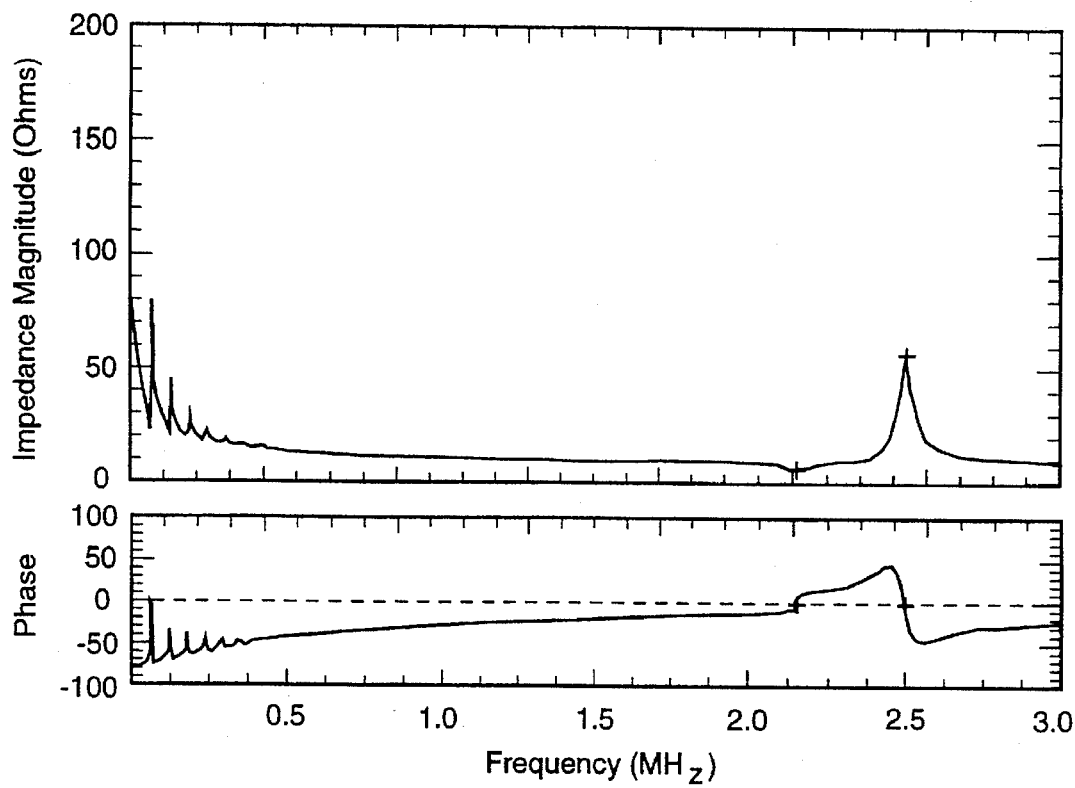
FIG. 3A is a plot of the electrical impedance of various frequencies of a 100 volume percent PZT-5H ceramic transducer.
Figure 3B:
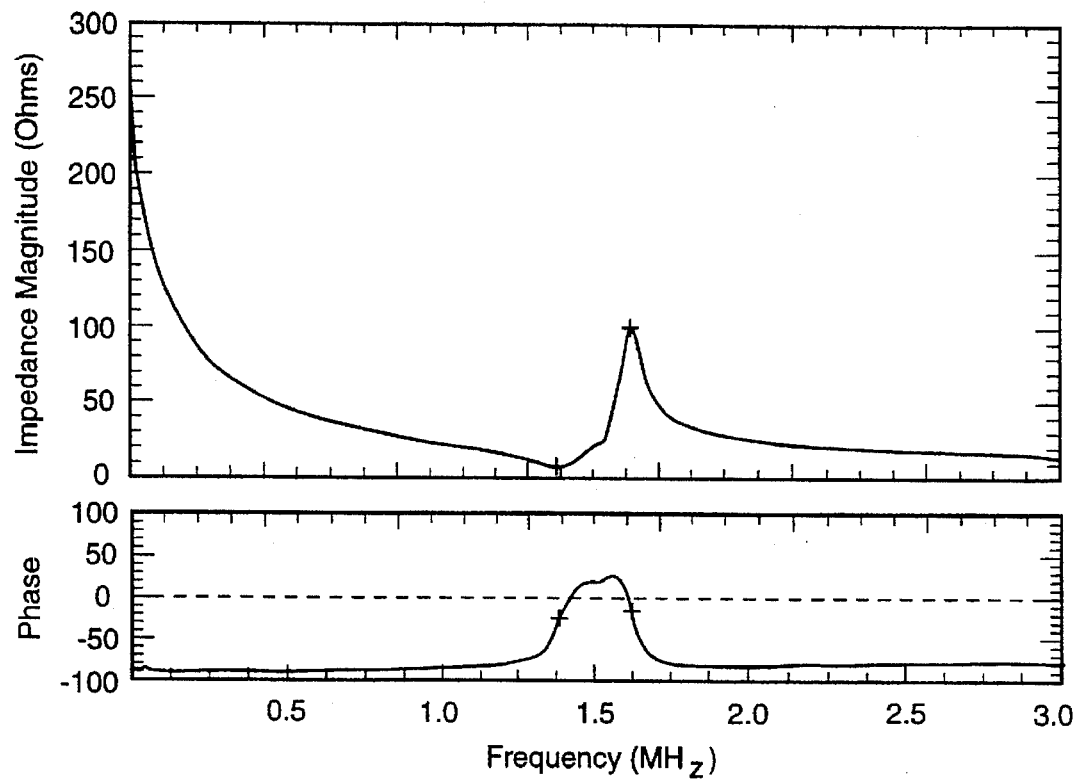
FIG. 3B is a plot of the electrical impedance of various frequencies of a 60 volume percent PZT-5H-40 volume percent polyether amine epoxy anisotropic 3-3 connectivity composite transducer.

A composite was prepared having the dimensions 1.41× 2.06×0.10 centimeters with approximately about 60 volume percent PZT ceramic. It resonated at 1.75 MHz; had an effective thickness coupling constant of 0.63, and acoustic impedance of 18.9 MRayls. The microstructure of the composite is shown in FIGS. 2a and 2b. The columnar arrangement of the ceramic is shown in the edge section of FIG. 2a. It can be seen that up to at least 500 microns of thickness that the ceramic columns are essentially vertically aligned in a parallel direction. A top view demonstrated in FIG. 2b shows the reduction in the lateral connectivity of the ceramic phase which enhances the effective piezoelectric coupling coefficient. The coupling to the lateral modes of the composite made by the method of this invention is reduced in comparison to a bulk ceramic as shown in FIGS. 3a and b. Further, the low frequency behavior in a bulk ceramic versus the composite is also shown in FIGS. 3a and b. The series of periodic resonances is visible in the bulk ceramic sample from low frequency lateral modes. These are essentially absent in the composite sample as shown in FIG. 3b.

TABLE 1

|  | PZT-5H ceramic | PZT-5H-epoxy composite |
| --- | --- | --- |
| Thickness coupling cnst. ($k_t$) | 0.53 | 0.63 |
| Planar Coupling Constant ($k_p$) | 0.58 | 0.22 |
| Spec. Acoustic Imped.-MRayls(Z) | 33 | 18.9 |
| Thickness Mode Resonance-MHz | 1.75 | 2.5 |
| Dielectric Constant ($K_{33}^T$) | 3200 | 1400 |

EXAMPLE 2

Ten samples of anisotropic 3-3 connectivity composite were made. The ceramic phase was PZT-5H and the infiltrate phase was polyether amine epoxy. Material properties of the samples were measured as indicated below in TABLE 2.

The typical value of the dielectric constant ($K_{33}^T$) of a 60 volume percent PZT-5H isotropic 3-3 connectivity composite is about 600 to 1000. For an isotropic 3-3 connectivity composite, $\log K_{33}^T = V_1 \log K_{33}^T{}_1 + V_2 \log K_{33}^T{}_2$, where V and $K_{33}^T$ are the volume percent and dielectric constant of phase 1 and 2 respectively. As a 3-3 connectivity composite changes from being isotropic to anisotropic the dielectric constant changes so that $K_{33}^T = V_1 K_{33}^T{}_1 + V_2 K_{33}^T{}_2$ when the most anisotropic arrangement of lamelli and interlamellar region occurs. Thus, the values of the dielectric constant ($K_{33}^T$) of samples made from the anisotropic 3-3 connectivity composite of the instant invention as shown in TABLE 2 show increase in dielectric constant of the composite that demonstrate the substantially parallel alignment of the lamelli.

Additionally, the thickness coupling constant ($k_t$) and specific acoustic impedance (Z) show improved performance of the electromechanical devices made from the anisotropic 3-3 connectivity composite of this invention.

TABLE 2

| Sample | PZT-5H Vol. % | Density gm/cm³ | Thick.Coupling Constant $k_t$ | Specific Acoustic Impedance Z (MRayls) | Dielectric Constant $K_{33}^T$ |
| --- | --- | --- | --- | --- | --- |
| 1 | 61 | 4.87 | 0.56 | 18.01 | 1546 |
| 2 | 60 | 4.77 | 0.57 | 17.63 | 1614 |
| 3 | 63 | 5.02 | 0.51 | 17.46 | 1346 |

TABLE 2-continued

| Sample | PZT-5H Vol. % | Density gm/cm$^3$ | Thick.Coupling Constant $k_t$ | Specific Acoustic Impedance Z (MRayls) | Dielectric Constant $K_{33}^T$ |
|---|---|---|---|---|---|
| 4 | 65 | 5.16 | 0.49 | 17.77 | 1347 |
| 5 | 63 | 5.07 | 0.44 | 16.35 | 1152 |
| 6 | 47 | 3.73 | 0.41 | 12.25 | 946 |
| 7 | 59 | 4.71 | 0.42 | 14.70 | 1042 |
| 8 | 72 | 5.72 | 0.42 | 18.58 | 1262 |
| 9 | 67 | 5.35 | 0.54 | 18.85 | 1226 |
| 10 | 68 | 5.40 | 0.63 | 18.87 | 1406 |

What is claimed is:

1. A process to form a piezoelectric composite having anisotropic 3-3 connectivity with a ceramic phase and an infiltrate phase, which comprises: forming a piezoelectric ceramic preform of interconnected lamelli by freeze drying a ceramic slurry or gel in a mold with a unidirectional heat flow where the connectivity of the lamelli in the Z direction is greater than the connectivity of the lamelli in the X and the Y direction, and the connectivity of the lamelli in the X and Y direction is substantially equal, and where the lamelli comprise from about 5 to 80 volume percent of the composite and are about 200 microns or less in width; sintering the ceramic preform at a temperature and for a time sufficient to densify the piezoelectric ceramic preform to at least about 95 percent of theoretical density; infiltrating interconnected interlamellar regions of the piezoelectric ceramic preform with the infiltrate phase under vacuum to form the piezoelectric composite having the ceramic phase and the infiltrate phase; and poling the piezoelectric composite in a electric field at a temperature below the Curie temperature of the ceramic phase.

2. A process according to claim 1 where the ceramic phase is selected from the group consisting of a metal titanate, a metal zirconate, a metal niobate, a metal tantalate, a metal tungstate, a metal stannate, and a solid solution thereof; and where the metal titanate is selected from the group consisting of barium titanate, lead titanate, strontium titanate, and bismuth titanate; where the metal zirconate is lead zirconate; where the metal niobate is selected from the group consisting of lead barium niobate, strontium barium niobate, lithium niobate, and lead metaniobate; and where the solid solution is selected from the group consisting of lead zirconate titanate, lead magnesium niobate-lead titanate, and lead zinc niobate-lead titanate.

3. A process according to claim 1 where the infiltrate phase is a polymer, low acoustic impedance glass, or low acoustic impedance cement, where the low acoustic impedance is less than or equal to 12 MRayls, and where the polymer is selected from the group consisting of an epoxy, an urethane, an elastomer, a silicone, and mixtures thereof.

* * * * *